(12) United States Patent
Sanpei et al.

(10) Patent No.: US 8,558,272 B2
(45) Date of Patent: Oct. 15, 2013

(54) ILLUMINATION APPARATUS HAVING A PLURALITY OF SEMICONDUCTOR LIGHT-EMITTING DEVICES

(75) Inventors: Tomohiro Sanpei, Yokosuka (JP); Masahiro Izumi, Fujisawa (JP); Shinji Nogi, Tokyo (JP); Akiko Saito, Yokohama (JP)

(73) Assignee: Toshiba Lighting & Technology Corporation, Tokyo (JP)

( * ) Notice: Subject to any disclaimer, the term of this patent is extended or adjusted under 35 U.S.C. 154(b) by 0 days.

(21) Appl. No.: 13/184,320

(22) Filed: Jul. 15, 2011

(65) Prior Publication Data

US 2011/0273880 A1    Nov. 10, 2011

Related U.S. Application Data

(63) Continuation of application No. 11/844,037, filed on Aug. 23, 2007, now Pat. No. 7,989,840.

(30) Foreign Application Priority Data

Aug. 29, 2006    (JP) .................................. 2006-232634

(51) Int. Cl.
*H01L 33/00*    (2010.01)

(52) U.S. Cl.
USPC ............ 257/99; 257/98; 257/88; 257/E25.02; 362/249.04; 362/652

(58) Field of Classification Search
USPC ........... 257/81, 82, 91, 98, 99, 100, 116, 117, 257/432–437, 749, E33.056–E33.059, 257/E25.032, 88, E25.02; 362/249.04, 652
See application file for complete search history.

(56) References Cited

U.S. PATENT DOCUMENTS

| | | | |
|---|---|---|---|
| 4,729,076 A | 3/1988 | Masami et al. | |
| 5,863,109 A | 1/1999 | Hsieh | |
| 5,954,423 A | 9/1999 | Logan et al. | |
| 6,034,712 A | 3/2000 | Iwasaki | |
| 6,310,364 B1 | 10/2001 | Uemura | |

(Continued)

FOREIGN PATENT DOCUMENTS

| | | |
|---|---|---|
| CN | 2665934 | 12/2004 |
| CN | 1880836 | 12/2006 |

(Continued)

OTHER PUBLICATIONS

English Abstract of JP Publication 728834 published 10/31/95 (corresponding to JP 3329573).

(Continued)

*Primary Examiner* — Zandra Smith
*Assistant Examiner* — Tsz Chiu
(74) *Attorney, Agent, or Firm* — DLA Piper LLP (US)

(57) ABSTRACT

An illumination apparatus includes a plurality of semiconductor light-emitting devices, a reflective layer, a plurality of conductor parts and a translucent adhesive layer. Each of the semiconductor light-emitting devices has a translucent substrate, and a semiconductor light-emitting layer formed on the substrate. The reflective layer has a size on which semiconductor light-emitting devices are arranged at intervals. The conductor parts are provided on the reflective layer, and electrically connected to the semiconductor light-emitting devices. The adhesive layer bonds the substrates of the semiconductor light-emitting devices onto the reflective layer, and thereby holds the semiconductor light-emitting devices on the reflective layer.

5 Claims, 7 Drawing Sheets

(56) References Cited

U.S. PATENT DOCUMENTS

| | | | |
|---|---|---|---|
| 6,415,531 | B1 | 7/2002 | Ohtsuki et al. |
| 7,193,243 | B2 * | 3/2007 | Park ................................ 257/80 |
| 7,427,145 | B2 * | 9/2008 | Jang et al. ..................... 362/236 |
| 2003/0137828 | A1 | 7/2003 | Ter-Hovhannisian |
| 2003/0189829 | A1 * | 10/2003 | Shimizu et al. ............... 362/240 |
| 2003/0189830 | A1 | 10/2003 | Sugimoto |
| 2004/0080938 | A1 | 4/2004 | Holman |
| 2005/0030752 | A1 | 2/2005 | Imai |
| 2005/0274971 | A1 | 12/2005 | Wang |
| 2006/0152931 | A1 | 7/2006 | Holman |
| 2006/0157724 | A1 | 7/2006 | Fujita |
| 2008/0057603 | A1 | 3/2008 | Wang |

FOREIGN PATENT DOCUMENTS

| | | |
|---|---|---|
| JP | 4-67360 | 3/1992 |
| JP | 7288341 | 10/1995 |
| JP | 8-264840 | 10/1996 |
| JP | 3329573 | 9/2002 |
| JP | 2005-235779 | 2/2005 |
| JP | 2006-41380 | 2/2006 |
| JP | 2006-93399 | 4/2006 |
| JP | 2006-140207 | 6/2006 |
| JP | 2007-116117 | 5/2007 |
| WO | WO 03/030274 | 4/2003 |
| WO | WO 03/056876 | 7/2003 |

OTHER PUBLICATIONS

English machine translation of JP 3329573 published Sep. 30, 2002.
Office Action issued in JP Appl 2007-184808 on May 25, 2010.
English Translation of Office Action issued in JP Appl 2007-184808 on May 25, 2010.
Office Action issued in CN Appl 2007-101455584.1 on Sep. 5, 2008.
Partial English Translation of Office Action issued in CN Appl 2007-101455584.1 on Sep. 5, 2008.
Office Action issued in CN 2007-101455584.1 on Jan. 23, 2009.
Partial English Translation of Office Action issued in CN 2007-101455584.1 on Jan. 23, 2009.
Office Action issued in JP Appl 2007-184808 on Jul. 20, 2010.
English Language Translation of Office Action issued in JP Appl 2007-184808 on Jul. 20, 2010.
English Abstract of JP 2006-41380 published Feb. 9, 2006.
Machine Language Translation of JP 2006-41380 published Feb. 9, 2006.
English Abstract of JP 8-264840 published Oct. 11, 1996.
Machine Language Translation of JP 8-264840 published Oct. 11, 1996.
English Abstract of JP 2005-235779 published Sep. 2, 2005.
Machine Language Translation of JP 2005-235779 published Sep. 2, 2005.
English Abstract of WO 2003/030274 published Apr. 10, 2003.
English Abstract of JP 2006-140207 published Jun. 1, 2006.
Machine Translation of JP 2006-140207 published Jun. 1, 2006.
English Abstract of JP 2007-116117 published 05/10/207.
Machine Translation of JP 2007-116117 published 05/10/207.
English Abstract of CN Appl 2665934 published Dec. 22, 2004.
English Translation of CN 1880836 published Dec. 20, 2006.
English Abstract of JP 4-67360 published Mar. 3, 1992.
Office Action issued in Japanese Appl 2007-184808 on Sep. 7, 2010.
English Translation of Office Action issued in Japanese Appl 2007-184808 on Sep. 7, 2010.
English Language Abstract of JP 2006-93399 published Apr. 6, 2006.
English Translation of JP 2006-93399 published Apr. 6, 2006.
English Abstract of JP 7288341 published Oct. 31, 1995.
U.S. Appl. No. 11/844,037.
European Search Report issued in EP 07253338 on Oct. 26, 2011.

\* cited by examiner

ILLUMINATION APPARATUS HAVING A PLURALITY OF SEMICONDUCTOR LIGHT-EMITTING DEVICES

CROSS REFERENCE TO RELATED APPLICATIONS

This application is a continuation of U.S. application Ser. No. 11/844,037, filed on. Aug. 23, 2007, which, in turn, claims the benefit of Japanese Patent Application No. 2006-232634 filed on Aug. 29, 2006, the applications and their disclosures being incorporated herein by reference in their entirety for all purposes.

BACKGROUND OF THE INVENTION

1. Field of the Invention

The present invention relates to an illumination apparatus using a plurality of semiconductor light-emitting devices, such as light-emitting diode chips, as a light source thereof.

2. Description of the Related Art

Known are LED displays having a plurality of light-emitting diode chips forming a pixel, and a cover member surrounding the light-emitting diode chips.

The light-emitting diode chips are mounted in a line on a printed wiring board. The cover member has a cavity which contains light-emitting diode chips for one pixel, and a sealing material formed of synthetic resin is filled into the cavity. The light-emitting diode chips for one pixel are molded as one unitary piece with the cover member by the sealing member. For example, Japanese Patent No. 3329573 discloses an LED display having such a structure.

In the conventional LED display disclosed in the patent gazette, light-emitting diode chips forming one pixel include a blue LED chip. Blue LED chips have a sapphire substrate on which a GaN-based compound semiconductor layer is superposed. The sapphire substrate is bonded to a printed wiring board by an insulating adhesive.

According to conventional LED displays, light traveling toward the printed wiring board among blue light emitted by the blue LED chip is reflected, and thereby brightness of the blue LED chip observed on an emitted light observing surface facing the printed wiring board is increased.

Specifically, a filler such as alumina fine powder is mixed into the insulating adhesive which bonds the sapphire substrate to the printed wiring board, and thereby the insulating adhesive is formed as a white reflective layer. Thereby, emitted blue light which passes through the sapphire substrate of the blue LED chip is reflected on a surface of the insulating adhesive which also serves as a reflective layer.

In another example, a transparent adhesive which does not contain a filler is used as insulating adhesive, and a conductive material such as Al, Ni, Ag, and Pt is evaporated or superposed by plating onto a portion of the printed wiring board corresponding to a sapphire substrate, and thereby a reflective layer is formed. Thereby, emitted blue light which passes through the sapphire substrate of the blue LED chip is guided to the printed wiring board, and reflected by the reflective layer.

In conventional LED displays, to deliver light effectively, a reflective layer is formed in a part of a printed wiring board corresponding to a blue LED chip, and thereby light reflectivity of the printed wiring board is enhanced.

However, a reflective layer exists only in a part corresponding to a blue LED chip, and the area of the reflective layer is relatively small in consideration of the size of the whole LED display. Therefore, in prior art, there is a possibility that the intensity of light is insufficient when the apparatus is used as an illumination apparatus for general illumination. Therefore, there is room for improvement in respect of obtaining sufficient light for practical use.

Further, conventional LED displays require a special step of evaporating, or forming by plating, a conductive material onto a specific part of the printed wiring board, or a step of printing paste containing white filler. This requires time and labor for forming a reflective layer, and increases the manufacturing cost of the illumination apparatus.

BRIEF SUMMARY OF THE INVENTION

An object of the present invention is to provide an illumination apparatus in which a reflective layer for reflecting light radiated from a semiconductor light-emitting device is easily formed, and which enables efficient delivery of light.

To achieve the above object, an illumination apparatus according to an embodiment of the invention comprises: a plurality of semiconductor light-emitting devices each having a translucent substrate and a semiconductor light-emitting layer formed on the substrate; a white reflective layer having a size on which the semiconductor light-emitting devices are arranged at intervals; a plurality of conductor parts to which the semiconductor light-emitting devices are electrically connected, the conductor parts being provided on the reflective layer; and a translucent adhesive layer which bonds the substrate of each of the semiconductor light-emitting devices onto the reflective layer, and thereby holds the semiconductor light-emitting devices on the reflective layer.

In the present invention, nitride semiconductors are preferably used as the semiconductor light-emitting devices. Further, as the semiconductor light-emitting devices, it is possible to use group III-V-based compound semiconductor, group II-IV-based compound semiconductor, and group IV-IV-based compound semiconductor. As the substrates of the semiconductor light-emitting devices, it is possible to use a crystalline substrate such as sapphire, quartz, SiC, and GaIN. The color of light emitted by the semiconductor light-emitting devices may be each of blue, red, and green. Further, the colors of light emitted by the semiconductor light-emitting devices may be different from each other, or the same.

In the present invention, the white reflective layer preferably has a reflectance which is as close to 100% as possible, as long as the reflectance is 85% or more in the region of a wavelength of 420 to 740 nm. An example of the white reflective layer of this type is an adhesive sheet, which is obtained by impregnating a sheet base material such as paper and cloth with a thermosetting resin material including at least one of aluminum oxide, titanium oxide, magnesium oxide, and barium sulfate. The adhesive sheet is called "prepreg".

Further, silver plating can be used as the white reflective layer. The silver plating is provided, with a predetermined thickness, on the surface of the baseboard formed of metal or synthetic resin.

In the present invention, as the translucent adhesive layer, it is possible to use, for example, a die bond material formed of epoxy resin, urea resin, acrylic resin, or silicone resin. The adhesive layer has a thickness of 100 to 500 .μm, and preferably has alight reflectance which is as close to 100% as possible, as long as the light reflectance is 70%.

As the adhesive layer of this type, it is particularly preferable to use a silicone-based adhesive layer. Silicone-based adhesive layers have a high light transmittance for light of all the wavelength ranges from ultraviolet rays to visible light. Further, silicone-based adhesive layers are excellent in that they are resistant to deterioration such as discoloration even when irradiated with light of a relatively short wavelength for a long time.

For example, a low-melting glass may be used as the translucent adhesive layer, instead of a resin-based die bond material.

In the present invention, the conductor parts are formed by subjecting a metal foil, such as a copper foil, superposed on the reflective layer to etching. Further, if the reflective layer has conductivity, the conductor parts are bonded onto the reflective layer by an electrical insulating adhesive.

The conductor parts on the reflective layer are electrically connected to the semiconductor light-emitting devices by means of wire bonding or the like. The semiconductor light-emitting devices are electrically connected to each other in series, in parallel, or by a combination thereof.

Further, in the present invention, it is preferable to cover the reflective layer, on which the semiconductor light-emitting devices are mounted, with a translucent sealing member, and mold the semiconductor light-emitting devices with the sealing member. However, the sealing member is not an indispensable constituent element, but can be omitted.

In some embodiments of the invention, substrates of the semiconductor light-emitting devices are bonded, by a translucent adhesive layer, onto a white reflective layer on which conductor parts are formed. The semiconductor light-emitting devices are electrically connected to the conductor parts, and held on the reflective layer by the adhesive layer.

According to the above structure, an illumination apparatus which can perform surface emission is obtained. Further, according to the illumination apparatus, light emitted from the semiconductor light-emitting devices are reflected by almost the whole area of the reflective layer having a size on which the semiconductor light-emitting devices are formed at intervals. Therefore, light is efficiently delivered in comparison with the case were light emitted from semiconductor light-emitting devices are reflected by parts corresponding to the respective semiconductor light-emitting devices.

In addition, since the substrates of the semiconductor light-emitting devices are bonded onto the reflective layer, it is unnecessary to form a plurality of reflective layers corresponding to the respective semiconductor light-emitting devices. Therefore, the reflective layer is easily formed.

According to some embodiments of the invention, the conductor parts are provided on the reflective layer to be adjacent to the semiconductor light-emitting devices, and a thickness of the substrates of the semiconductor light-emitting devices is larger than a thickness of the conductor parts.

According to the invention, the substrates of the semiconductor light-emitting devices have a light-transmitting property. Therefore, part of light made incident on the substrates from the semiconductor light-emitting layers and part of light reflected by the reflective layer and made incident on the substrates again are dissipated from the side surfaces of the substrates to the outside of the semiconductor light-emitting devices. Simultaneously, light is also dissipated sideways from the semiconductor light-emitting layers.

The thickness of the conductor parts adjacent to the semiconductor light-emitting devices on the reflective layer is smaller than the thickness of the substrates of the semiconductor light-emitting devices. Therefore, although the conductor parts are located in a direction of dissipating light emitted from the semiconductor light-emitting devices, the probability that light dissipated sideways from the substrates is obstructed by the conductor parts is reduced. Therefore, loss of light due to interference of light with the conductor parts is suppressed, and a structure preferable for efficiently delivering light is achieved.

Some embodiments of the invention further comprise a light diffusion member which diffuses light emitted from the semiconductor light-emitting devices, the light diffusion member being opposed to the reflective layer.

According to the invention, light emitted from the semiconductor light-emitting devices directly toward the light diffusion member and light reflected by the reflective layer toward the light diffusion member are diffused when they passes through the light diffusion member. This structure reduces the visual impression that the semiconductor light-emitting devices serving as light sources appears to be individual separate light sources.

In other words, the difference in brightness between parts of the light diffusion member, which correspond to the semiconductor light-emitting devices, and surrounding parts is reduced, and thus the semiconductor light-emitting devices do not appear as individual dot light sources. As a result, the impression of existence of the individual semiconductor light-emitting devices is reduced, and a structure preferable for achieving surface emission is obtained.

According to some embodiments of the invention, the reflective layer also serves as an insulating layer, and a thickness of the insulating layer falls within a range from 30 to 90 .μm.

According to the invention, when the thickness of the insulating layer is less than 30 .μm, light passes through the insulating layer. This reduces the light reflectance and insulating property of the insulating layer. Conversely, the thickness of the insulating layer exceeds 90 .μm, thermal resistance of the insulating layer is increased. Consequently, the heat radiation property of the insulating layer is reduced, and the insulating layer cannot efficiently dissipate heat of the semiconductor light-emitting devices. This has an adverse influence on the life of the semiconductor light-emitting devices. Therefore, the thickness of the reflective layer also serving as the insulating layer is specified as described above, and thus the heat radiation property of the semiconductor light-emitting devices is maintained, without deteriorating the reflectance of the reflective layer.

In some embodiments of the invention, the reflective layer is formed of silver plating.

According to the invention, heat of the semiconductor light-emitting devices is efficiently dissipated into the reflective layer, in comparison with the case where the reflective layer is formed of resin. This structure reduces thermal resistance of a package including the semiconductor light-emitting devices and the reflective layer, and prevents increase in temperature of the semiconductor light-emitting devices.

In some embodiments of the invention, the substrates of the semiconductor light-emitting devices and the conductor parts are thermally connected to the reflective layer, and the semiconductor light-emitting layers of the semiconductor light-emitting devices are electrically and thermally connected to the conductive parts by bonding wires.

According to the invention, heat of the semiconductor light-emitting devices is directly dissipated into the reflective layer. In addition, part of heat of the semiconductor light-emitting devices is conducted to the conductor parts through bonding wires. Therefore, heat generated by the semiconductor light-emitting devices is released from the conductor parts to the reflective layer. This structure sufficiently secures a heat transmission path from the semiconductor light-emitting devices to the reflective layer, and prevents increase in temperature of the semiconductor light-emitting devices with reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A first embodiment of the present invention is described below with reference to FIGS. 1 to 4.

Figure 1:
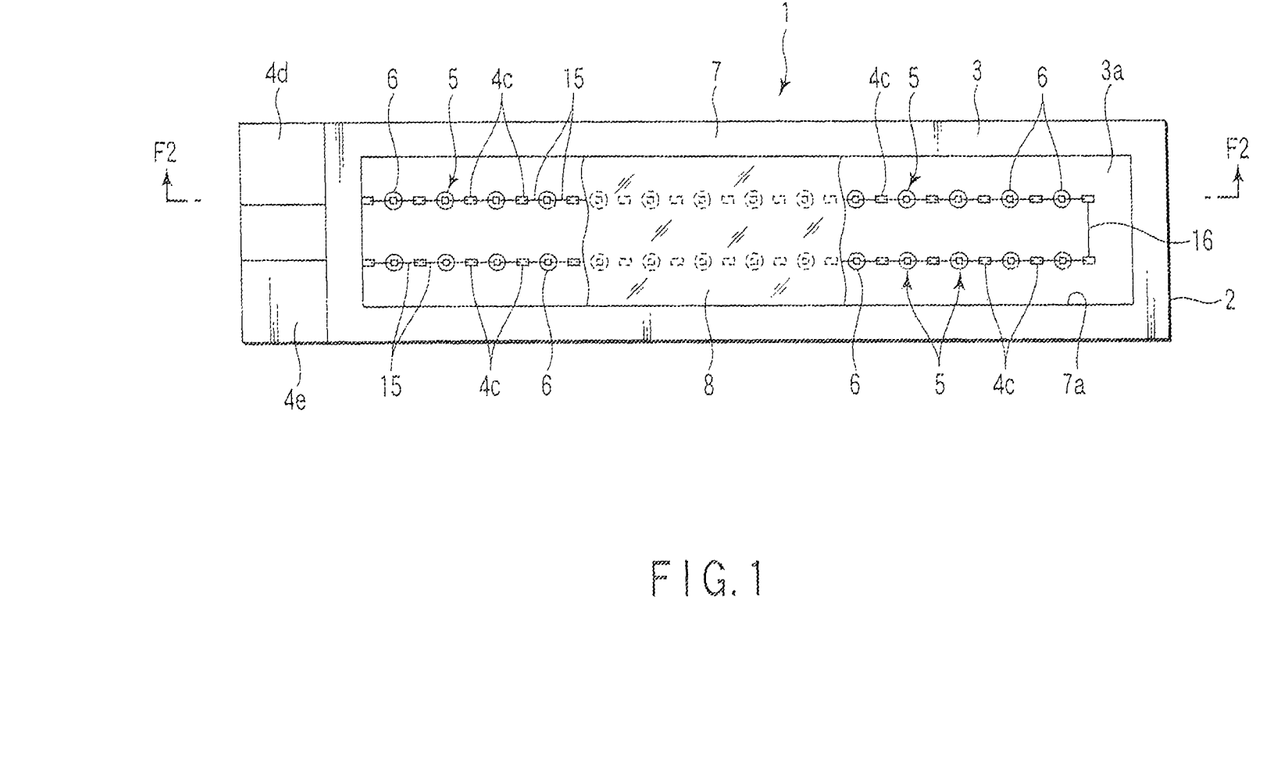
FIG. 1 is a plan view of an exemplary illumination apparatus according to a first embodiment of the present invention, a part of which is cut away.
Figure 2:
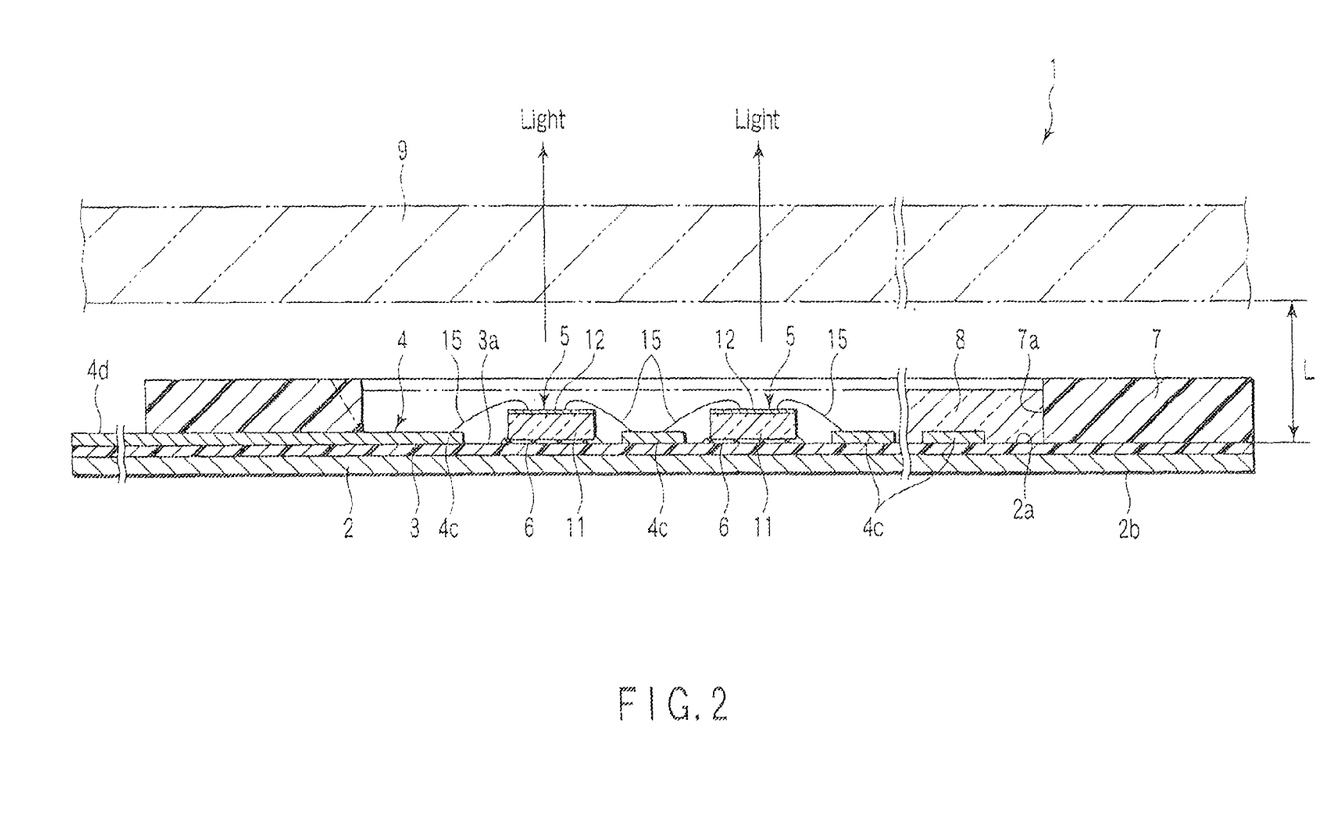
FIG. 2 is an exemplary cross-sectional view taken along line F2-F2 of FIG. 1.

FIGS. 1 and 2 illustrate an illumination apparatus 1. The illumination apparatus 1 forms an LED package formed as a unit serving as one module. The illumination apparatus 1 comprises a baseboard 2, a reflective layer 3, a circuit pattern 4, a plurality of semiconductor light-emitting devices 5, an adhesive layer 6, a reflector 7, a sealing member 8, and a light diffusion member 9.

The baseboard 2 is a flat board formed of, for example, a synthetic resin, and is rectangular to obtain a light-emitting area necessary for the illumination apparatus 1. As illustrated in FIG. 2, the baseboard 2 has a front surface 2a, and a back surface 2b located on the reverse side of the front surface 2a. Epoxy resin including glass powder is preferably used as material of the baseboard 2.

The material of the baseboard 2 is not limited to synthetic resin, but metal can also be used as the material of the baseboard 2. When the baseboard 2 is formed of metal, heat dissipation from the back surface 2b of the baseboard 2 is improved, and temperature distribution of the baseboard 2 is equalized. This structure is preferable to inhibit variation of color of light emitted from the semiconductor light-emitting devices 5 which emit light of the same wavelength region.

To inhibit variation of color of emitted light, it is desirable to form the baseboard 2 of a metal material having excellent heat conductivity. Examples of metal material having excellent heat conductivity are aluminum having a heat conductivity of 10 w/mK or more, and an alloy thereof.

The reflective layer 3 is layered on the front surface 2a of the baseboard 2, and has a size enough to arrange semiconductor light-emitting devices 5 of a predetermined number thereon with intervals. The reflective layer 3 is formed of a white insulating material. Prepreg in the form of a sheet is used as the insulating material. Prepreg is a material obtained by impregnating a sheet base material with thermosetting resin containing white powder such as aluminum oxide or the like, and has adhesion by itself. Therefore, the reflective layer 3 is adhered to the front surface 2a of the baseboard 2, and covers the baseboard 2. The reflective layer 3 has a flat light reflective surface 3a which is disposed on a side not facing the baseboard 2.

Figure 4:
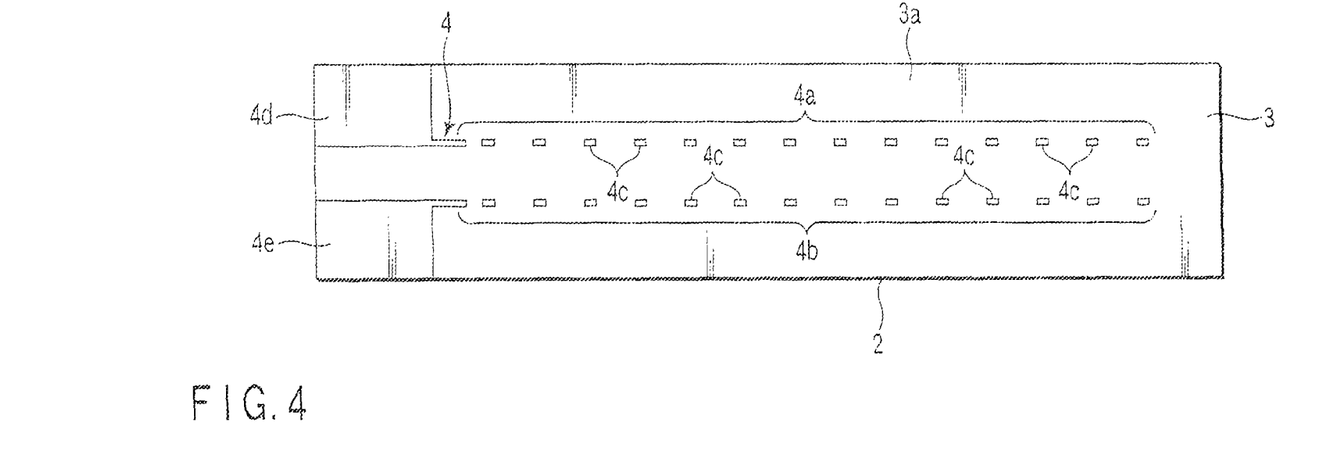
FIG. 4 is an exemplary plan view of the illumination apparatus according to the first embodiment of the present invention, illustrating a state where a circuit pattern is formed on a light reflective surface of a reflective layer.

As illustrated in FIG. 4, the circuit pattern 4 is formed on the light reflective surface 3a of the reflective layer 3. The circuit pattern 4 has a first conductor line 4a and a second conductor line 4b. The first and second conductor lines 4a and 4b extend longitudinally relative to the baseboard 2, and are arranged parallel to each other and separated by an interval.

The first conductor line 4a has a plurality of pads 4c serving as conductor parts, and a first terminal part 4d. In the same manner, the second conductor line 4b has a plurality of pads 4c serving as conductor parts, and a second terminal part 4e. The pads 4c are arranged longitudinally at intervals relative to the baseboard 2. The first terminal part 4d is formed as one unitary piece with the pad 4c located at one end of the first conductor line 4a. The second terminal part 4e is formed as one unitary piece with the pad 4c located at one end of the second conductor line 4b.

The first and second terminal parts 4d and 4e are adjacent to each other at one end portion longitudinally relative to the baseboard 2. Further, the first and second terminal parts 4d and 4c are electrically insulated by the reflective layer 3. A power supply cable is connected to each of the first and the second terminal parts 4d and 4e by means of soldering or the like.

The circuit pattern 4 according to the first embodiment is formed by the following process.

First, a prepreg impregnated with uncured thermosetting resin is bonded onto the front surface 2a of the baseboard 2, and the front surface 2a of the baseboard 2 is covered with the reflective layer 3. Next, a copper foil having the same size as that of the reflective layer 3 is adhered onto the reflective layer 3, and thereby a laminated member is formed. Thereafter, the laminated member is heated and pressurized simultaneously, and thereby the thermosetting resin is cured. Thereby, the baseboard 2 and the copper foil are bonded to the reflective layer 3 as one unitary piece. Then, a resist layer is superposed on the copper foil, and the copper foil is subjected to etching. Thereafter, the resist layer is removed, and thereby a circuit pattern 4 is formed on the reflective layer 3. The thickness A (refer to FIG. 3) of the copper foil forming the circuit pattern 4 is, for example, 35 .μm.

Figure 3:
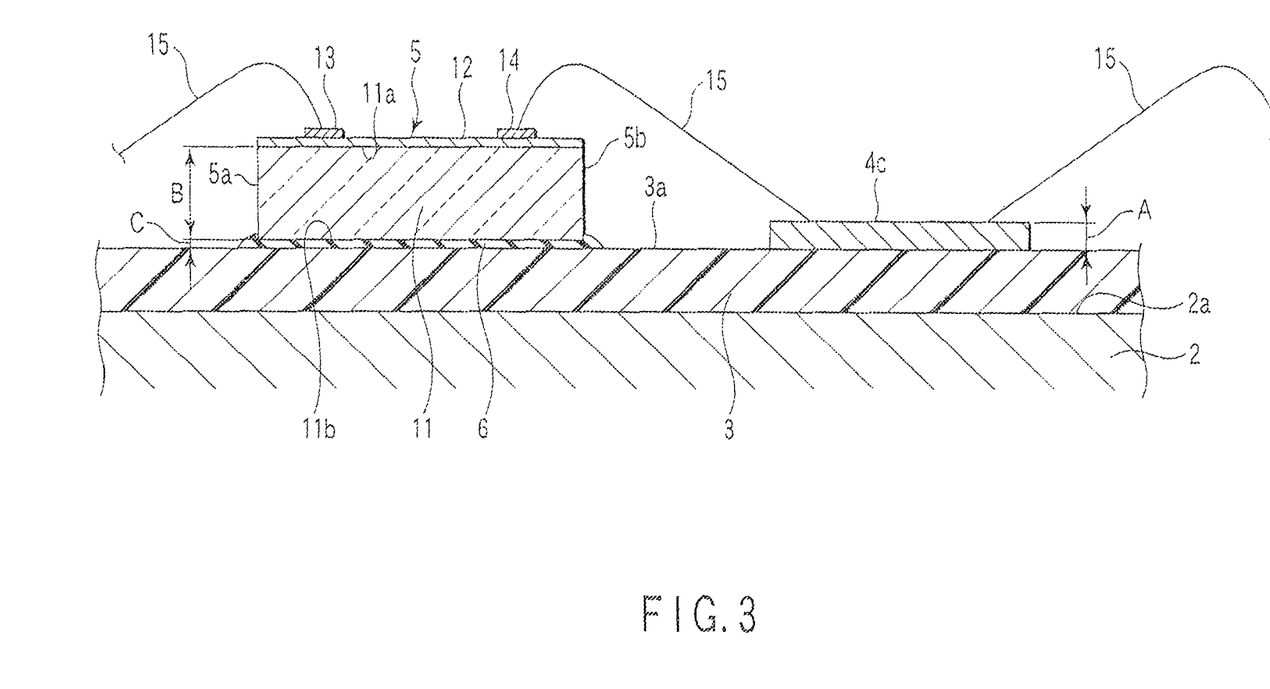
FIG. 3 is an exemplary enlarged cross-sectional view of the first embodiment of the present invention, illustrating a positional relationship between a semiconductor light-emitting device and a pad.

Double-wire blue LED chips using, for example, nitride semiconductor are used as the semiconductor light-emitting devices 5. As illustrated in FIGS. 2 and 3, each of the semiconductor light-emitting devices 5 has a substrate 11 having a light-transmitting property, and a semiconductor light-emitting layer 12.

For example, a sapphire substrate is used as the substrate 11. The substrate 11 has a first surface 11*a*, and a second surface 11*b* located on the reverse side of the first surface 11*a*. In the first embodiment, the first surface 11*a* and the second surface 11*b* are parallel to each other. The thickness 2 of the substrate 11 is, for example, 90 .µm, which is larger than the thickness of the pads 4*c* of the circuit pattern 4.

The semiconductor light-emitting layer 12 is formed by successively stacking a buffer layer, an n-type semiconductor layer, a light-emitting layer, a p-type clad layer, and a p-type semiconductor layer on the first surface 11*a* of the substrate 11. The light-emitting layer has a quantum well structure obtained by alternately stacking barrier layers and a well layer. The n-type semiconductor layer has an n-side electrode 13. The p-type semiconductor layer has a p-side electrode 14. The semiconductor light-emitting layer 12 of this type does not have a reflective film, and radiates light to both sides relative to the thickness.

As illustrated in FIG. 1, each of the semiconductor light-emitting devices 5 is arranged between pads 4*c* which are adjacent to each other longitudinally relative to the baseboard 2, and is bonded onto the same light reflective surface 3*a* of the reflective layer 3 by the adhesive layer 6. Specifically, the second surface 11*b* of the substrate 11 of each semiconductor light emitting device 5 is bonded onto the light reflective surface 3*a* by the adhesive layer 6. As a result, the pads 4*c* of the circuit pattern 4 and the semiconductor light-emitting devices 5 are alternately arranged on the light reflective surface 3*a*.

As illustrated in FIGS. 2 and 3, each of the semiconductor light-emitting devices 5 has a pair of side surfaces 5*a* and 5*b*. One side surface 5*a* of each semiconductor light-emitting device 5 is opposed to one adjacent pad 4*c*. The other side surface 5*b* of each semiconductor light-emitting device 5 is opposed to another adjacent pad 4*c*.

The thickness C of the adhesive layer 6 interposed between the semiconductor light-emitting devices 5 and the light reflective surface 3*a* is, for example, 100 to 500 .µm. A silicone-resin-based adhesive is preferably used as the adhesive layer 6. The silicone-resin-based adhesive has a light-transmitting property which achieves a light transmittance of 70% or more when the thickness is 100.µm or more, for example.

As illustrated in FIGS. 2 and 3, the electrodes 13 and 14 of each semiconductor light-transmitting device 5 are electrically connected to the adjacent pads 4*c* of the circuit pattern 4 by wire bonding. Specifically, the n-side electrode 13 is electrically connected to a pad 4*c* adjacent to the side surface 5*a* of the semiconductor light-emitting device 5 by a bonding wire 15. The p-side electrode 14 is electrically connected to another pad 4*c* adjacent to the side surface 5*b* of the semiconductor light-emitting device 5 by the bonding wire 15.

Further, a pad 4*c* which is located on a side reverse to the first terminal part 4*d* in the first conductor line 4*a* is electrically connected with a pad 4*c* which is located on a side reverse to the second terminal part 4*e* in the second conductor line 4*b* by another bonding wire 16 (refer to FIG. 1). Therefore, according to the first embodiment, the semiconductor light-emitting devices 5 are connected in series through the circuit pattern 4.

As illustrated in FIG. 1, the reflector 7 is a rectangular frame, and surrounds all the semiconductor light-emitting devices 5 on the reflective layer 3 by itself. In other words, the reflector 7 is not provided for each of the semiconductor light-emitting devices 5, but serves as a constituent element common to all the semiconductor light-emitting devices 5.

The reflector 7 is bonded to the light reflective surface 3*a* of the reflective layer 3. In the first embodiment, all the semiconductor light-emitting devices 5 and all the pads 4 of the circuit pattern 4 are located in a region surrounded by the reflector 7. The first and second terminal parts 4*d* and 4*e* of the circuit pattern 4 are located outside the reflector 7.

The reflector 7 is formed of synthetic resin or the like, and an internal surface of the reflector 7 serves as a light reflective surface 7*a*. The light reflective surface 7*a* is formed by evaporating, or forming by plating, a metal material having high reflectance such as Al and Ni onto the internal surface of the reflector 7. The light reflective surface 7*a* can also be formed by applying white paint having high visible light reflectance onto the internal surface of the reflector 7.

Further, the light reflective surface 7*a* itself can be provided with a white color with high visible light reflectance, by mixing white powder into resin material forming the reflector 7. A white filler such as aluminum oxide, titanium oxide, magnesium oxide, and barium sulfate can be used as the white powder. As illustrated by chain double-dashed lines in FIG. 2, the light reflective surface 7*a* of the reflector 7 is preferably inclined toward the outside of the reflector 7 as it goes away from the light reflective surface 3*a* of the reflective layer 3.

As illustrated in FIG. 2, the sealing member 8 is injected into the region surrounded by the reflector 7. The sealing member 8 is solidified in the state of covering the semiconductor light-emitting devices 5, the pads 4*c* and the bonding wires 15 and 16. The sealing member 8 is formed of a material having a light-transmitting property, such as a transparent silicone resin and a transparent glass.

Fluorescent particles are mixed into the material forming the sealing member 8, if necessary. In the first embodiment, blue LED chips are used as the semiconductor light-emitting devices 5. Therefore, used are fluorescent particles which perform wavelength conversion to convert blue primary light emitted from the blue LED chips into yellow secondary light having a different wavelength. As a preferably example, the fluorescent particles are mixed into the sealing member 8 in the state of being almost uniformly dispersed in the sealing member 8.

In the case of using the sealing member 8 containing fluorescent particles, the fluorescent particles, which blue light emitted from the semiconductor light-emitting layer 12 strikes, absorbs the blue light and emits yellow light. The yellow light passes through the sealing member 8. On the other hand, part of the blue light radiated from the semiconductor light-emitting layer 12 passes through the sealing member 8, without striking the fluorescent particles. Therefore, light beams of two colors having a relationship of complementary colors are mixed, and thereby white light is obtained.

As illustrated in FIG. 2, the light diffusion member 9 is flat and is disposed in front of the reflector 7. The light diffusion member 9 may be directly supported by the reflector 7, or may be supported by an illumination appliance (not shown) containing the illumination apparatus 1.

As the light diffusion member 9, it is desirable to use a material having a light diffusion property, in which difference between transmittance for blue light having a wavelength of 400 to 480 nm and transmittance for yellow light having a wavelength of 540 to 650 nm is 10% or less, and visible light transmittance equal to or larger than 90% and less than 100%. By using the light diffusion member 9 satisfying the above conditions, blue primary light and yellow secondary light are mixed by the light diffusion member 9, and thereby white light is obtained with suppressed unevenness in color.

As illustrated in FIG. 2, the distance L between the light diffusion member 9 and the light reflective surface 3a, on which the semiconductor light-emitting devices 5 are arranged, preferably falls within a range from 5 to 15 mm.

The inventor(s) of the present invention prepared an illumination apparatus 1 using a light diffusion member 9 having transmittance of 90%, and an illumination apparatus 1 using a light diffusion member 9 having transmittance of 80%, and performed the following lighting test. In the lighting test, the total luminous flux was measured in each of the two illumination apparatuses 1 under the conditions in which the distance L ranges from 5 to 15 mm, and the visual impression of the light diffusion members 9 was evaluated.

The visual impression indicates whether the semiconductor light-emitting devices 5 appear to individually emit light in a dotted manner. In the first embodiment, the visual impression is evaluated with criteria of "good" and "not good".

The "good" visual impression means that the semiconductor light-emitting devices 5 do not appear to be individual dot light sources, and difference in brightness between parts of the light diffusion member 9 corresponding to the semiconductor light-emitting devices 5 and surrounding parts is small. Conversely, the "not good" visual impression means that the semiconductor light-emitting devices 5 are clearly recognized as individual light sources, and difference in brightness between parts of the light diffusion member 9 corresponding to the semiconductor light-emitting devices 5 and surrounding parts is large.

The illumination apparatus 1 using the light diffusion member 9 having transmittance of 90% had the total luminous flux of 100 lm, and the visual impression thereof was evaluated as "good". The illumination apparatus 1 using the light diffusion member 9 having transmittance of 80% had the total luminous flux of 90 μm, and the visual impression thereof was evaluated as "good". This result shows that the transmittance of the light diffusion member 9 is preferably set to 90% or more.

On the other hand, the inventor(s) of the present invention researched relationship between the total luminous flux and the visual impression when the distance L between the light reflective surface 3a of the reflective layer 3 and the light diffusion member 9 is varied, in the illumination apparatus 1 using the light diffusion member 9 having transmittance of 90%.

As a result, when the distance L was less than 5 mm, the total luminous flux of the illumination apparatus 1 was 105 lm, and the visual impression was "not good". When the distance L exceeded 15 mm, the total luminous flux was 95 lm, and the visual impression was "good".

Therefore, when the distance L is less than 5 mm, the semiconductor light-emitting devices 5 become easily recognized as individual dot light sources. Conversely, when the distance L exceeds 15 mm, the brightness becomes insufficient. Therefore, it proved that setting the distance L to a range from 5 to 15 mm secures brightness necessary for illumination purpose, and prevents the semiconductor light-emitting devices 5 from being viewed as individual dot light sources.

As a result, it is preferable from a practical standpoint to use light diffusion member 9 having visible light transmittance of 90% or more in the illumination apparatus 1, and set the distance L between the light reflective surface 3a of the reflective layer 3 and the light, diffusion member 9 to a range from 5 to 15 mm.

On the other hand, in the illumination apparatus 1 of the first embodiment, the reflectance of the light reflective surface 3a of the reflective layer 3 is preferably 85% or more in a region of a wavelength of 420 to 740 nm. When the reflectance is less than 85%, efficiency of reflecting light emitted from the semiconductor light-emitting layers 12 toward the baseboard 2 through the substrates 11 by the light reflective surface 3a is low, and light of the semiconductor light-emitting devices 5 is not efficiently obtained.

Figure 5:
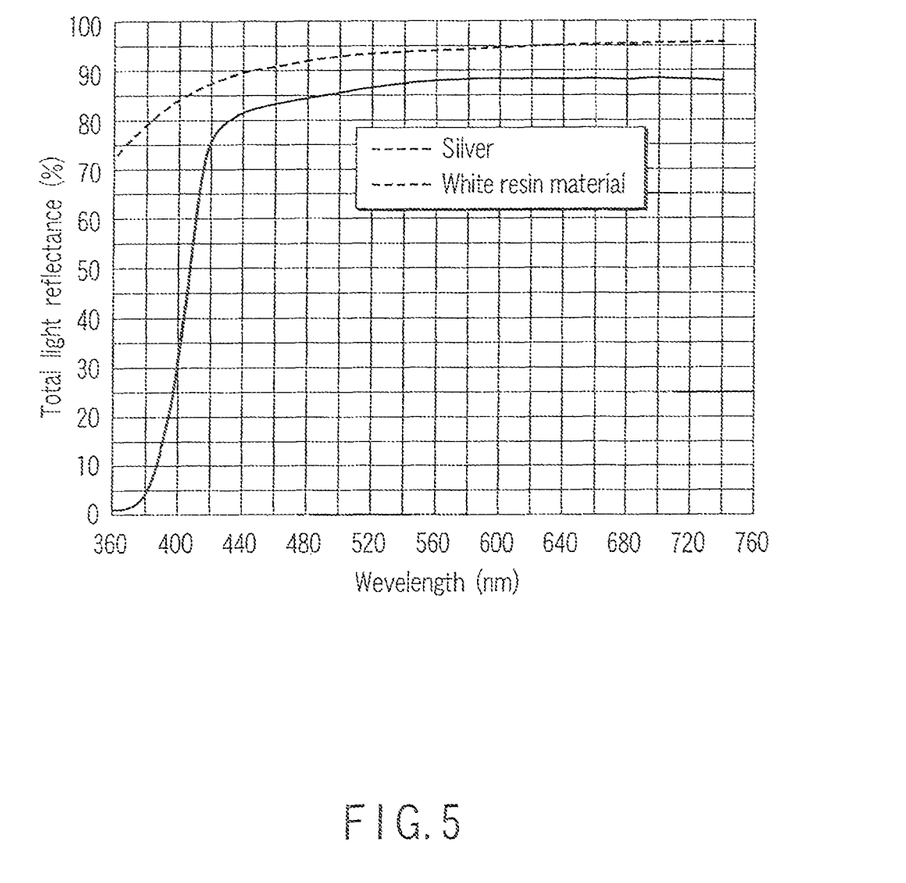
FIG. 5 is an exemplary graph illustrating total light reflectance of a white reflective layer used for the illumination apparatus in the first embodiment of the present invention.

FIG. 5 is a graph illustrating relationship between total light reflectance of the white resin material used for the reflective layer 3 and wavelength (nm). In FIG. 5, a solid line indicates total light reflectance of the white resin material, and a dotted line illustrates total light reflectance of silver as a comparative example. Silver has total light reflectance of 85% or more in the whole region of a wavelength of 400 to 740 nm. In comparison with this, the white resin material has total light reflectance of 35% at a wavelength of 400 nm, and has total light reflectance of 85% in a region of wavelength of 480 to 740 nm. However, the average of total light reflectance is 85% or more in the whole region of a wavelength of 420 to 740 nm, and thus light emitted from the semiconductor light-emitting devices 5 can be efficiently and sufficiently delivered.

Further, to secure the heat radiation property of the reflective layer 3 while securing the reflectance thereof, the thickness T of the reflective layer 3 is preferably set to a range from 30 to 90 .μm. Table illustrates reflectance at a wavelength of 460 nm, reflectance at a wavelength of 550 nm, and thermal resistance (° C./W) for each of the cases where the thickness T of the reflective layer 3 is set to 30, 90, and 120.μm. As is clear from Table 1, the reflective layer 3 shows a characteristic that the reflectance thereof decreases as the thickness T decreases, and the thermal resistance thereof increases as the thickness T increases.

TABLE 1

| Thickness | Reflectance [460 nm] | Reflectance [550 nm] | Thermal resistance Rjs [° C./W] |
|---|---|---|---|
| 30 | 80.56 | 85.79 | 550 |
| 90 | 83.44 | 86.69 | 600 |
| 120 | 84.88 | 87.14 | 700 |

The life of semiconductor light-emitting devices 5 is 40000 hours when used at a junction temperature of 100° C. Therefore, to lengthen the life of the semiconductor light-emitting devices 5, the semiconductor light-emitting devices 5 are preferably used at a junction temperature of 100° C. or less.

Table 2 illustrates a relationship between the thickness T of the reflective layer 3 and increase in temperature of the reflective layer 3, when the semiconductor light-emitting devices 5 are lit up by applying electric power of 0.06 W, in the case where a wattage per chip of the semiconductor light-emitting devices 5 is 0.06 W. As is clear from Table 1 and Table 2, since thermal resistance of the reflective layer 3 decreases as the thickness T of the reflective layer 3 decreases, heat conducted from the semiconductor light-emitting devices 5 to the reflective layer 3 is efficiently diffused, and increase in temperature of the reflective layer 3 is prevented. In comparison with this, since thermal resistance of the reflective layer 3 increases as the thickness T of the reflective layer 3 increases, and thus increase in temperature of the reflective layer 3 is promoted.

TABLE 2

| Thickness | Increase in temperature [° C.] |
| --- | --- |
| 30 | 33 |
| 90 | 36 |
| 120 | 42 |

For example, in an enclosed illumination appliance using semiconductor light-emitting devices obtaining luminous flux of 5000 lm as light source, the atmospheric temperature in the appliance reaches 60 to 70° C. A value obtained by adding the atmospheric temperature to the value of increase in temperature shown in Table 2 is the junction temperature of the appliance. Therefore, when the thickness T of the reflective layer 3 is 120.μm, the junction temperature exceeds 100° C. Therefore, to suppress the junction temperature not to exceed 100° C., it is necessary to set the thickness T of the reflective layer 3 to 90.μm or less.

On the other hand, when the thickness T of the reflective layer 3 is reduced, light undesirably passes through the reflective layer 3, and thus light reflectance of the reflective layer 3 decreases. Table 3 illustrates a relationship between the thickness of the reflective layer 3 and total luminous flux (lm) per chip of the semiconductor light-emitting devices 5. It is required that the percentage of decrease in the total luminous flux is suppressed to about 10%, supposing that a value of the total luminous flux when the thickness T of the reflective layer 3 is 120.μm is set as the maximum value. Therefore, the necessary thickness T of the reflective layer 3 is 30.μm or more.

TABLE 3

| Thickness | Total luminous flux per chip [lm] | Percentage [%] |
| --- | --- | --- |
| 30 | 5.74 | 93.3 |
| 90 | 6.01 | 97.7 |
| 120 | 6.15 | 100.0 |

In consideration of the above, the thickness T of the reflective layer 3 is preferably set to a value which falls within a range from 30 to 90.μm. Thereby, the heat radiation property of the reflective layer 3 is enhanced, while the reflectance of the reflective layer 3 is secured.

According to the first embodiment, the substrates 11 of the semiconductor light-emitting devices 5 are bonded onto the white reflective layer 3, on which the pads 4c are formed, by the translucent adhesive layer 6. The semiconductor light-emitting devices 5 are electrically connected to the pads 4, and held in a line on the light reflective surface 3a of the reflective layer 3, with the adhesive layer 6 interposed therebetween. By the above structure, an illumination apparatus 1 which can perform surface emission is obtained.

According to the illumination apparatus 1, part of light emitted from the semiconductor light-emitting layer 12 of each semiconductor light-emitting device 5 passes through the substrate 11 and travels toward the reflective layer 3, which is reverse to the normal light guiding direction indicated by arrows in FIG. 2. The light traveling toward the reflective layer 3 is made incident on a region of the reflective layer 3 corresponding to the projection area of the substrate 11 through the adhesive layer 6, and is reflected by the light reflective surface 3a of the reflective layer 3 in the normal light guiding direction.

Further, among light traveling from the semiconductor light-emitting layers 12 toward the reflective layer 3, light which has slantingly passed through the substrates 11 toward the surroundings of the substrates 11 is reflected by the light reflective surface 3a located around the substrates 11 in the normal light guiding direction.

Simultaneously, when light emitted from the semiconductor light-emitting layers 12 in the normal light guiding direction strikes the fluorescent particles inside the sealing member 8, part of secondary light having yellow color travels toward the reflective layer 3. The yellow light traveling toward the reflective layer 3 is also reflected by the light reflective surface 3a in the normal light guiding direction.

Therefore, light traveling from the semiconductor light-emitting layers 12 toward the reflective layer 3 is reflected not only by parts of the light reflective surface 3a corresponding to the respective semiconductor light-emitting devices 5, but also by parts of the light reflective surface 3a located outside the semiconductor light-emitting devices 5 in the normal light guiding direction. Specifically, all the regions of the light reflective surface 3a except regions covered with the pads 4c are used to reflect light traveling from the semiconductor light-emitting layers 12 toward the reflective layer 3 in the normal light guiding direction. Therefore, light is efficiently delivered from the illumination apparatus 1.

Further, light emitted from the semiconductor light-emitting layers 12 is radiated toward the surroundings of the substrates 11. Therefore, part of light made incident on the substrates 11 from the semiconductor light-emitting layers 12 and part of light made incident on the substrates 11 again through the adhesive layer 6 after reflected by the light reflective surface 3a of the reflective layer 3 are radiated to the outside of the substrates 11 through the first and second side surfaces 5a and 5b of the semiconductor light-emitting devices 5. The pads 4c which are electrically connected to the semiconductor light-emitting devices 5 are located adjacent to the first and second side surfaces 5a and 5b of the semiconductor light-emitting devices 5. Therefore, light radiated from the first and second side surfaces 5a and 5b may interfere with the pads 4c, and may be absorbed into the pads 4c.

However, according to the first embodiment, the thickness A of the pads 4c is smaller than the thickness B of the substrates 11. Therefore, light radiated from the first and second side surfaces 5a and 5b of the semiconductor light-emitting devices 5 toward the pads 4c does not easily interfere with the pads 4c, and loss of light is reduced. This structure has an advantage in efficient delivery of light.

Further, the pads 4c of the circuit pattern 4 and the semiconductor light-emitting devices 5 are arranged longitudinally relative to the baseboard 2. This structure reduces the total area of the pads 4c covering the light-reflective surface 3a of the reflective layer 3. Consequently, a substantial area of the light reflective surface 3a which contributes to reflection is sufficiently secured, which is also advantageous in efficient delivery of light.

In addition, the single reflector 7 surrounds all the semiconductor light-emitting devices 5. This structure remarkably reduces the possibility that light emitted from the individual semiconductor light-emitting devices 5 interferes with the reflector 7, and thus increases the amount of light traveling toward the light diffusion member 9. In other words, light made incident on the light reflective surface 7a of the reflector 7 is reduced, light is not easily absorbed into the light reflective surface 7a, and loss of light due to absorption of light is reduced. Therefore, light emitted from the semiconductor light-emitting devices 5 is efficiently delivered.

For example, if a reflector having a radially-spreading reflective surface is provided for each of, or each group of, semiconductor light-emitting devices, light radiated from respective semiconductor light-emitting devices are made incident on the light reflective surfaces of the respective reflectors. Therefore, amount of light made incident on the reflectors increases, and the probability that light is absorbed into the light reflective surface is increased. Thus, loss of light is increased, and light emitted from the semiconductor light-emitting devices cannot be efficiently delivered.

The efficiency of delivering light was evaluated by the following comparison. The illumination apparatus used in this comparison has a baseboard made of aluminum, and reflectance of the reflective layer thereof is 90% for light of a wavelength of 400 to 740 nm. Further, a die bond material having a 100 μm thickness and 95% transmittance was used as the adhesive layer, 28 semiconductor light-emitting devices were arranged on the reflective layer, and a single reflector surrounded all the semiconductor light-emitting devices by oneself. The luminous flux when the illumination apparatus is lit by energizing it with 20 mA was 120 μm.

In comparison with this, an illumination apparatus serving as a comparative example had a structure in which 28 reflectors were provided, and the reflectors included respective semiconductor light-emitting devices. The luminous flux of the illumination apparatus when the illumination apparatus was lit by energizing it with 20 mA was 1.10 lm.

In the illumination apparatus 1 of the first embodiment, a plurality of bonding wires 15 runs between the light reflective surface 3a of the reflective layer 3 and the light diffusion member 9. Therefore, part of light which is reflected by the light reflective surface 3a and travels toward the light diffusion member 9 is obstructed by the bonding wires 15.

According to the first embodiment, the bonding wires 15 connect adjacent semiconductor light-emitting devices 5 in series. Therefore, the number of the bonding wires 15 is reduced, in comparison with the case where a plurality of semiconductor light-emitting devices 5 are connected in parallel by bonding wires 15. Thereby, this structure is advantageous in efficiently delivering light emitted from the semiconductor light-emitting devices 5.

When a plurality of semiconductor light-emitting devices are connected in parallel, it is necessary to form a plurality of pattern parts in a straight line on the reflective layer 3 along the arranging direction of the semiconductor light-emitting devices 5, and electrically connect the pattern parts and the respective semiconductor light-emitting devices 5 by respective bonding wires. This structure reduces the area of a part of the light reflective surface 3a which actually contributes to reflection, and is not preferable in consideration of delivery of light.

In the illumination apparatus 1 according to the first embodiment, a plurality of semiconductor light-emitting devices 5 are bonded onto the reflective layer 3 on which the circuit pattern 4 is formed. Therefore, it is unnecessary to individually form a plurality of reflective layers corresponding to the respective semiconductor light-emitting devices 5 on the baseboard 2. Therefore, the reflective layer 3 can be easily formed without special process, and the manufacturing cost of the illumination apparatus 1 is reduced.

More specifically, in the conventional structure in which light of the semiconductor light-emitting devices is reflected by using white insulating adhesive including a white filler, it is required to precisely apply a small amount of insulating adhesive for each of minute semiconductor light-emitting devices. This deteriorates the workability, and requires much labor and time in work. Further, to control the thickness and the application area of the insulating adhesive to a specified value incurs much difficulty also in respect of manufacturing technology.

In comparison with this, the illumination apparatus 1 of the first embodiment, the reflective layer 3 only continuously covers the surface 2a of the baseboard 2. Therefore, no technically difficult work is required for forming the reflective layer 3. Therefore, the reflective layer 3 is easily formed on the baseboard 2, and the manufacturing cost of the illumination apparatus 1 is reduced.

In addition, in prior art, since work of applying insulating adhesive incurs much difficulty, the thickness of insulating adhesive applied to individual semiconductor light-emitting devices becomes nonuniform, and variations in the thermal resistance of the insulating adhesive is inevitable. This causes a slight difference in heat radiation properties between the semiconductor light-emitting devices, and the color of light emitted from the semiconductor light-emitting devices may vary.

In comparison with this, according to the illumination apparatus 1 of the first embodiment, the reflective layer 3 is superposed with a predetermined thickness on the surface 2a to cover the whole front surface 2a of the baseboard 2. Therefore, the reflective layer 3 does not have an adverse influence on the heat radiation property of the semiconductor light-emitting devices 5. This structure prevents a slight difference in color of emitted light of the semiconductor light-emitting devices 5.

The present invention is not limited to the above first embodiment, but can be carried out with various modifications within a range not departing from the gist of the invention.

Figure 6:
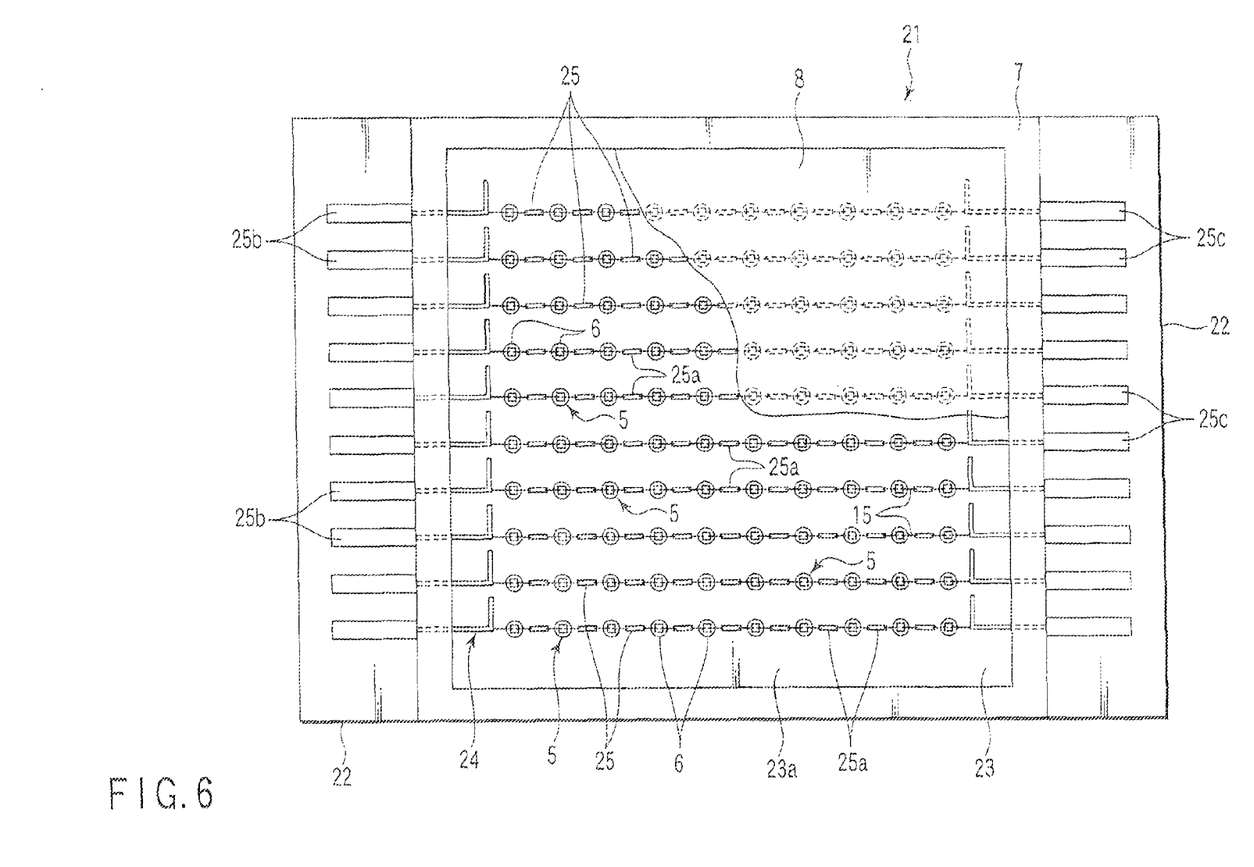
FIG. 6 is a plan view of an exemplary illumination apparatus according to a second embodiment of the present invention, a part of which is cut away.
Figure 7:
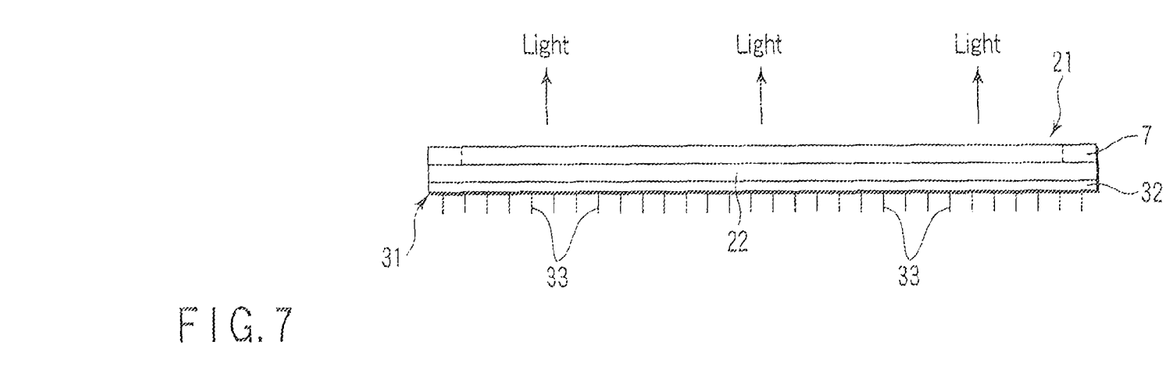
FIG. 7 is an exemplary side view of the illumination apparatus according to the second embodiment of the present invention.
Figure 8:
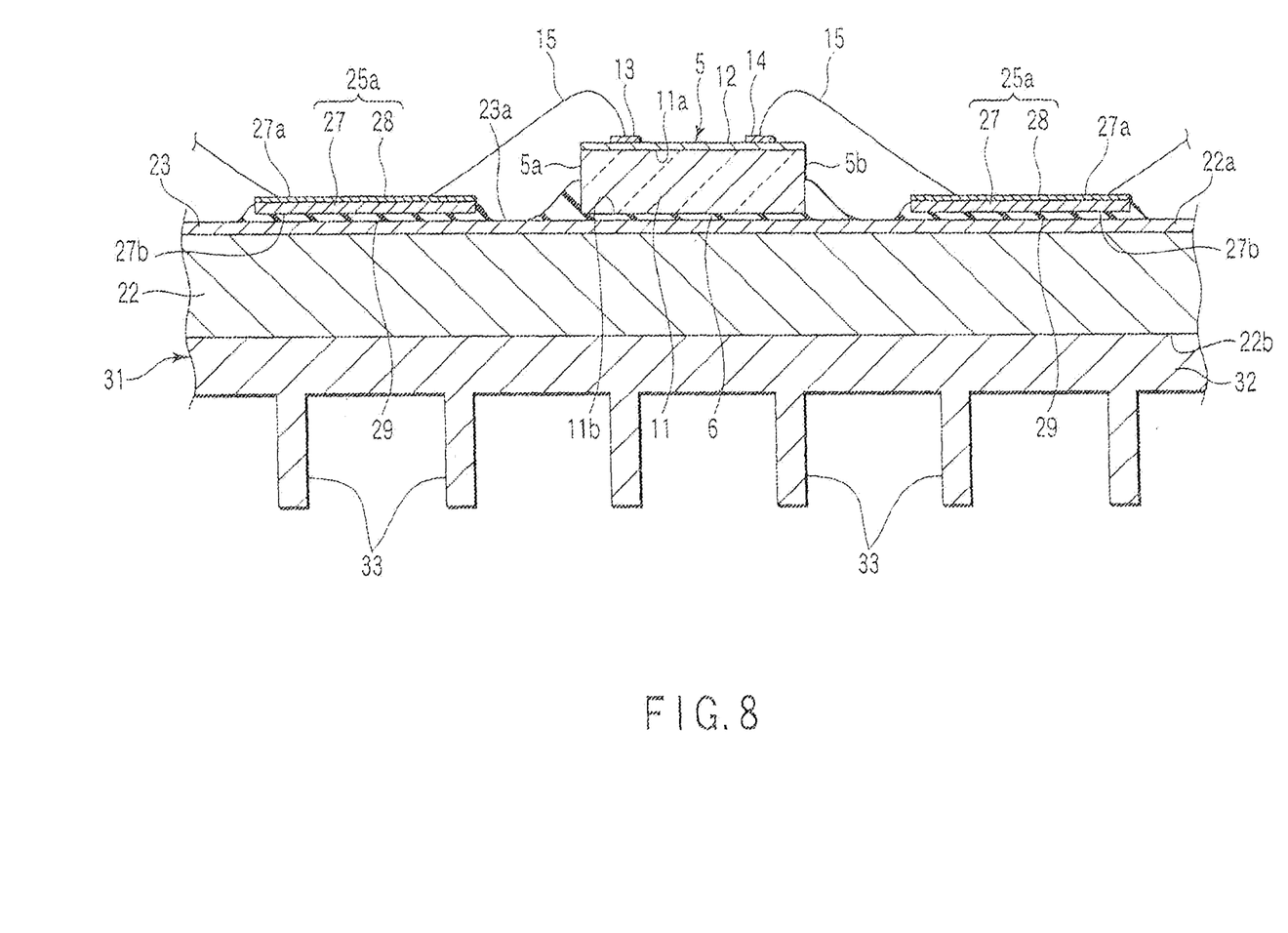
FIG. 8 is an exemplary enlarged cross-sectional view of the second embodiment of the present invention, illustrating a positional relationship between a semiconductor light-emitting device, pads, and a heat sink.

FIGS. 6 to 8 illustrate an illumination apparatus 21 according to the second embodiment of the present invention. The illumination apparatus 21 is different from the illumination apparatus of the first embodiment mainly in the structure for increasing the heat radiation property of the semiconductor light-emitting devices 5. The other parts of the illumination apparatus 21 are basically the same as those in the first embodiment. Therefore, in the second embodiment, constituent elements which are the same as those in the first embodiment are denoted by the same respective reference numerals, and explanation thereof is omitted.

As illustrated in FIGS. 6 to 8, a baseboard 22 is a flat metal board, and is rectangular to secure a light emission area necessary for the illumination apparatus 21. The baseboard 22 has a front surface 22a, and a back surface 22b located on the reverse side of the front surface 22a. The baseboard 22 is preferably formed of copper which has excellent thermal conductivity.

A reflective layer 23 is superposed on the front surface 22a of the baseboard 22. The reflective layer 23 is formed by plating the baseboard 22 with silver, and has conductivity. The reflective layer 23 covers the whole front surface 22a of the baseboard 22, and has a sufficient size on which a predetermined number of semiconductor light-emitting devices 5 are arranged at intervals. The reflective layer 23 has a flat light reflective surface 23a which is located on a side not facing the baseboard 22.

The diffusion reflectance of the light reflective surface 23a is preferably 70% or more in a region of a wavelength of 420 to 740 nm. The diffusion reflectance is evaluated with a value supposing that the diffusion reflectance of white barium sulfate is 100%. When the diffusion reflectance of the light reflective surface 23a is 70% or more, the average of total light reflectance of the light reflective surface 23a in the region of a wavelength of 420 to 740 nm exceeds 85%. Therefore, light is efficiently delivered.

A circuit pattern 24 is formed on the light reflective surface 23a of the reflective layer 23. The circuit pattern 24 has a plurality of conductor lines 25. The conductor lines 25 extend longitudinally relative to the baseboard 22, and are arranged parallel to and separated from each other.

Each conductor line 25 has a plurality of pads 25a serving as conductor parts, a first terminal part 25b, and a second terminal part 25c. The pads 25a are arranged at intervals longitudinally relative to the baseboard 22. The first terminal part 25b is formed as one unitary piece with a pad 25a located at one end of each conductor line 25. The second terminal part 25c is formed as one unitary piece with a pad 25a located at the other end of each conductor line 25. Therefore, the first terminal part 25b and the second terminal part 25c are separated from each other longitudinally relative to each conductor line 25.

As illustrated in FIG. 8, each pad 25a has an insulator 27 and a conductive layer 28. For example, ceramic is used as the insulator 27. The insulator 27 has a first surface 27a and a second surface 27b located on the reverse side of the first surface 27a. The first surface 27a and the second surface 27b are parallel to each other. The conductor layer 28 is fowled by plating the first surface 27a with gold or the like.

Each pad 25a is bonded onto the light reflective surface 23a of the reflective layer 23 by an insulating adhesive 29. The insulating adhesive 29 is filled between the second surface 27b of the insulator 27 and the light reflective surface 23a, and holds the insulator 27 on the light reflective surface 23a. Therefore, a space between the conductive layer 28 of each pad 25a and the reflective layer 23 formed of silver plating is maintained at an electrically insulated state.

The first and second terminal parts 25b and 25c of the circuit pattern 24 have the same structure as that of the above pads 25a, and explanation thereof is omitted.

Semiconductor light-emitting devices 5 which are the same as those in the first embodiment are arranged on the light reflective surface 23a of the reflective layer 23. Each semiconductor light-emitting device 5 is located between two pads 25a which are longitudinally adjacent relative to the baseboard 22, and bonded onto the light reflective surface 23a of the reflective layer 23 by the adhesive layer 6.

As illustrated in FIG. 8, an n-side electrode 13 of each semiconductor light-emitting device 5 is electrically connected to the conductive layer 28 of a pad 25a adjacent to a side surface of the semiconductor light-emitting device 5 by a bonding wire 15. A p-side electrode 14 of each semiconductor light-emitting device 5 is electrically connected to the conductive layer 28 of a pad 25a adjacent to a side surface Sb of the semiconductor light-emitting device 5 by the bonding wire 15. Therefore, the semiconductor light-emitting devices 5 are connected in series in each of the conductor lines 25 of the circuit pattern 24.

As illustrated in FIGS. 7 and 8, a heat sink 31 is attached to the back surface 22b of the baseboard 22. The heat sink 31 has a heat-receiving board 32 and a plurality of heat-radiating fins 33.

The heat-receiving board 32 has a size enough to cover the whole back surf ace 22b of the baseboard 22. The heat-receiving board 32 is fixed on the back: surface 22b of the baseboard 22 by means of bonding or the like, and thermally connected to the baseboard 22. The heat-radiating fins 33 are formed as one unitary piece with the heat-receiving board 32. The heat-radiating fins 33 project from the heat-receiving board 32 toward the side reverse to the baseboard 22.

In the second embodiment, when the semiconductor light-emitting devices 5 emit light, the semiconductor light-emitting devices 5 generate heat. The semiconductor light-emitting devices 5 are bonded onto the reflective layer 23 formed of silver plating, and are thermally connected to the reflective layer 23. Therefore, heat generated by the semiconductor light-emitting devices 5 is directly conducted to the reflective layer 23 through the adhesive layer 6.

The reflective layer 23 formed of silver plating has high thermal conductivity in comparison with the resin reflective layer 3 of the first embodiment. Therefore, the thermal resistance of a package formed by incorporating the semiconductor light-emitting devices 5 with the baseboard 22 is reduced.

The thermal resistance of the package is evaluated by the following expression, when the temperature of the semiconductor light-emitting devices 5 when they are lit is Tj, and the temperature of the package when the semiconductor light-emitting devices 5 are lit is Tc:

$$Tj=Tc/W(W: \text{supplied electric power})$$

The inventor(s) of the present invention mounted 100 semiconductor light-emitting devices having a power rating of 20 mA on a reflective layer, and tested the thermal resistance of the package when the semiconductor light-emitting devices were lit up by supplying electric power of 6.0 W.

As a result, the package using a reflective layer 23 formed of silver plating had a thermal resistance of 0.6° C./W, and the package using a reflective layer 3 formed of resin had a thermal resistance of 7.0° C./W.

In view of the above, the reflective layer 23 formed of silver plating has better thermal conductivity than the reflective layer 3 formed of resin, and can efficiently relieve heat of the semiconductor light-emitting devices 5 to the baseboard 22.

Further, according to the second embodiment, heat of each semiconductor light-emitting device 5 is conducted to the adjacent pads 25a through the bonding wires 15. Since the pads 25a are bonded to the reflective layer 23 formed of silver plating, the pads 25a are maintained at a state of being thermally connected to the reflective layer 23. Therefore, the heat of the semiconductor light-emitting devices 5 conducted to the pads 25a through the bonding wire 15 is conducted to the reflective layer 23 through the insulating adhesive 29. Therefore, part of heat generated by the semiconductor light-emitting devices 5 is relieved from the pads 25a to the reflective layer 23.

As a result, heat of the semiconductor light-emitting devices 5 is smoothly diffused into the baseboard 22 through the reflective layer 23. Therefore, the semiconductor light-emitting devices 5 are prevented from overheating, and the atmospheric temperature of the semiconductor light-emitting devices 5 is maintained at a proper temperature.

In addition, according to the second embodiment, the heat sink 31 is provided on the back surface 22b of the baseboard 22. The heat sink 31 receives heat from the baseboard 22, and radiates the heat from the heat-radiating fins 33 into the atmosphere.

Therefore, heat relieved from the semiconductor light-emitting devices 5 to the baseboard 22 through the reflective layer 23 is smoothly radiated to the outside of the illumination apparatus 1 through the heat sink 31. This improves the heat-radiating property of the baseboard 22, and thus is preferable in suppressing increase in temperature of the semiconductor light-emitting devices 5.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. An illumination apparatus comprising:
a flat board comprising a flat light reflective surface;
a plurality of light-emitting elements arranged in intervals on the flat light reflective surface, each of the light-emitting elements comprising a translucent substrate and a light emitting layer formed on the substrate, the substrates being directly bonded to the flat light reflective surface by translucent adhesive layers, and the light-emitting layers being thinner than the substrates;
a wiring layer disposed on the flat board, the wiring layer being thinner than the substrates of the light-emitting elements;
a single frame disposed on the flat board, the single frame surrounding all of the plurality of light-emitting elements and the wiring layer; and
a sealing member disposed in a single region surrounded by the single frame, the sealing member formed of a material having a light-transmitting property and covering all of the plurality of light-emitting elements, the wiring member, and the flat light reflective surface;
wherein the substrates of the light-emitting elements and the light-emitting layers protrude at a position higher than the wiring layer.

2. The illumination apparatus of claim 1, wherein the light-emitting elements are electrically connected to the wiring layer on the flat light reflective surface.

3. The illumination apparatus of claim 1, wherein the single frame comprises a light reflective surface facing the single region in which the sealing member is disposed.

4. An illumination apparatus comprising:
a flat board;
a reflective layer disposed on the flat board, the reflective layer comprising a flat light reflective surface;
a plurality of light-emitting elements, each of the plurality of light-emitting elements comprising a translucent substrate and a light-emitting layer, the substrate including a first surface and a second surface positioned on a reverse side of the first surface, the second surfaces of the translucent substrates being directly bonded to the flat light reflective surface by translucent adhesive layers, and the light-emitting layers being formed on the first surfaces and being thinner than the substrates;
a wiring layer being provided on the flat board, the wiring layer being thinner than the substrates of the light-emitting elements;
a single frame disposed on the reflective layer, the single frame surrounding all of the plurality of light-emitting elements and the wiring layer; and
a sealing member disposed in a single a region surrounded by the single frame, the sealing member formed of a material having a light-transmitting property and covering all of the plurality of light-emitting elements, the wiring layer, and the flat light reflective surface;
wherein the first surfaces of the substrates of the light-emitting elements protrude at a position higher than the wiring layer.

5. The illumination apparatus of claim 4, wherein the wiring layer is electrically connected to the light-emitting elements.

* * * * *